(12) United States Patent
Suri et al.

(10) Patent No.: US 9,208,434 B2
(45) Date of Patent: Dec. 8, 2015

(54) NEUROMORPHIC SYSTEM EXPLOITING THE INTRINSIC CHARACTERISTICS OF MEMORY CELLS

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE-CNRS, Paris (FR)

(72) Inventors: Manan Suri, Grenoble (FR); Olivier Bichler, Massy (FR); Barbara De Salvo, Montbonnot Saint Martin (FR); Christian Gamrat, Les Ulis (FR); Damien Querlioz, Sceaux (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 137 days.

(21) Appl. No.: 14/038,197

(22) Filed: Sep. 26, 2013

(65) Prior Publication Data
US 2014/0172762 A1 Jun. 19, 2014

(30) Foreign Application Priority Data
Sep. 26, 2012 (FR) .................................... 12 59050

(51) Int. Cl.
*G06F 15/18* (2006.01)
*G06N 3/08* (2006.01)
(Continued)

(52) U.S. Cl.
CPC ................ *G06N 3/08* (2013.01); *G06N 3/049* (2013.01); *G06N 3/063* (2013.01); *G06N 3/086* (2013.01); *G11C 11/54* (2013.01)

(58) Field of Classification Search
USPC ........................................... 706/25
See application file for complete search history.

(56) References Cited

U.S. PATENT DOCUMENTS 8,597,997 B2 * 12/2013 Ivanova-Hristova et al. . 438/257
8,606,463 B2 * 12/2013 Bichler et al. .................. 701/41
(Continued)

OTHER PUBLICATIONS

Lagrange Stability of Memristive Neural Networks With Discrete and Distributed Delays Ailong Wu; Zhigang Zeng Neural Networks and Learning Systems, IEEE Transactions on Year: 2014, vol. 25, Issue: 4 pp. 690-703, DOI: 10.1109/TNNLS.2013.2280458 Referenced in: IEEE Journals & Magazines.*
(Continued)

*Primary Examiner* — Michael B Holmes
(74) *Attorney, Agent, or Firm* — Baker & Hostetler LLP

(57) ABSTRACT

A neuromorphic system comprises a set of at least one input neuron, a set of at least one output neuron and a synaptic network formed from a set of at least one variable-resistance memristive component, said synaptic network connecting at least one input neuron to at least one output neuron, the resistance of the at least one memristive component being adjusted by delivering to the synaptic network write pulses generated by the at least one input neuron, and return pulses generated by the at least one output neuron, the characteristics of the write and return pulses being deduced from the intrinsic characteristics of the at least one memristive component so that the combination of a write pulse and a return pulse in the at least one memristive component results in a modification of its resistance according to a learning rule chosen beforehand.

11 Claims, 4 Drawing Sheets

(51) Int. Cl.
*G06N 3/04* (2006.01)
*G06N 3/063* (2006.01)
*G11C 11/54* (2006.01)

(56) References Cited

U.S. PATENT DOCUMENTS

| | | | | |
|---|---|---|---|---|
| 9,015,094 | B2* | 4/2015 | Suri et al. | 706/26 |
| 9,053,976 | B2* | 6/2015 | Ernst et al. | 1/1 |
| 2010/0123222 | A1* | 5/2010 | Ivanova-Hristova et al. | 257/632 |
| 2011/0169067 | A1* | 7/2011 | Ernst et al. | 257/316 |
| 2012/0011093 | A1 | 1/2012 | Aparin et al. | |
| 2012/0109459 | A1* | 5/2012 | Bichler et al. | 701/41 |
| 2012/0330873 | A1* | 12/2012 | Suri et al. | 706/26 |
| 2014/0122402 | A1* | 5/2014 | Bichler et al. | 706/27 |
| 2014/0129498 | A1* | 5/2014 | Bichler et al. | 706/25 |
| 2014/0172762 | A1* | 6/2014 | Suri et al. | 706/25 |
| 2015/0006455 | A1* | 1/2015 | Suri et al. | 706/32 |

OTHER PUBLICATIONS

Linearly separable pattern classification using memristive crossbar circuits Singh, K.; Sahu, C.; Singh, J. Quality Electronic Design (ISQED), 2014 15th International Symposium on Year: 2014 pp. 323-329, DOI: 10.1109/ISQED.2014.6783343 Referenced in: IEEE Conference Publications.*

Neuromorphic pattern learning using HBM electronic synapse with excitatory and inhibitory plasticity Teyuh Chou; Jen-Chieh Liu; Li-Wen Chiu; I-Ting Wang; Chia-Ming Tsai; Tuo-Hung Hou VLSI Technology, Systems and Application (VLSI-TSA), 2015 International Symposium on Year: 2015 pp. 1-2, DOI: 10.1109/VLSI-TSA.2015.7117582.*

Homogeneous Spiking Neuromorphic System for Real-World Pattern Recognition Xinyu Wu; Saxena, V.; Kehan Zhu Emerging and Selected Topics in Circuits and Systems, IEEE Journal on Year: 2015, vol. 5, Issue: 2 pp. 254-266, DOI: 10.1109/JETCAS.2015.2433552.*

J-S Seo, et al: "A 45nm CMOS neuromorphic chip with a scalable architecture for learning in networks of spiking neurons", Proceedings of the 2011 IEEE Custom Integrated Circuits Conference (CICC'11), Sep. 19, 2011, XP032063741, DOI: 10.1109/CICC.2011.6055293.

Oliver Bichler, et al., "Extraction of Temporally Correlated Features from Dynamic Vision Sensors with Spike-Timing-Dependent Plasticity", Neural Networks, Special Issue, Feb. 14, 2012, pp. 339-348, vol. 32, Elsevier, XP55064709.

O. Bichler, "Apprentissage Neuro-Inspire Avec Des Nano-Dispositifs Memristifs", Actes des 14e Journees Nationales du Reseau Doctoral en Micro-Nanoelectronique (JNRDM "11), May 23, 2011, pp. 11-15, XP55064708, URL:http://www.cnfm.fr/VersionFrancaise/animations/JNRDM/articles_JNRDM2011/Conception-test/BICHLER%20Olivier.pdf.

M. Suri, et al., "CBRAM Device as Binar Synapses for Low-Power Stochastic Neuromorphic Systems:Auditory (Cochlea and Visual (Retina) Cognitive Processing Applications", Technical Program of the 2012 IEEE Internaitonal Electron Devices Meeting (IEDM "2012), Sep. 8, 2012, pp. 22, XP55064706, http://wayback.archive.org/web/20120916013712/www.his.com/~iedm/program/2012_techprogram.pdf.

J-S Seo, et al., "A 45nm CMOS Neuromorphic Chip with a Scalable Architecture for Learning in Networks of Spiking Neurons", Proceedings of the 2011 IEEE Custom Integrated Circuits Conference (CICC "11), Sep. 19, 2011, XP032063741.

M. DiVentra, et al., "Biologically-Inspired Electronics with Memory Circuit Elements", Dec. 21, 2011, XP55064707, http://arxiv.org/pdf/1112.4987v1.pdf.

* cited by examiner

NEUROMORPHIC SYSTEM EXPLOITING THE INTRINSIC CHARACTERISTICS OF MEMORY CELLS

CROSS-REFERENCE TO RELATED APPLICATIONS

This application claims priority to foreign French patent application No. FR 1259050, filed on Sep. 26, 2012.

FIELD OF THE INVENTION

The invention relates to a neuromorphic system exploiting the intrinsic characteristics of memory cells. It is applicable to the field of artificial neural networks. Schematically, these networks are inspired by biological neural networks the function of which they imitate.

BACKGROUND

Artificial neuronal networks are essentially composed of neurons interconnected to one another by synapses. The synapses are conventionally formed from digital memories or resistive components the conductance of which varies depending on the voltage or current applied to their terminals.

A learning rule conventionally used in pulsed neural networks is the spike-timing dependent plasticity (STDP) rule. This is a biologically inspired rule the objective of which is to reproduce the learning function performed by biological neurons and synapses. For such a rule to be implemented, the conductance of the synapses must vary depending on the relative arrival times of "pre-" and "post-" synaptic pulses transmitted by the neurons connected to the input and output of the synapse, respectively. With the STDP rule, the conductance of a synapse is increased if its post-synaptic neuron is activated after its pre-synaptic neuron, and decreased in the opposite case. Furthermore, the conductance variation also depends on the exact delay time between pulses generated following activation of the neurons. Typically, the larger the delay time, the smaller the variation in conductance will be.

To implement an STDP rule or any other unsupervised learning method, it is necessary for the conductance of the memristive components that form the artificial synapses of the network to be able to vary gradually, both upwards and downwards, depending on the voltage or the current applied to their terminals. Furthermore, it is desirable if this can occur without prior knowledge of the conductance state of the synapse.

Cells using conductive bridging random access memory (CBRAM) technology are for example employed to form the synapses of the neuronal network. These cells are conventionally grouped in a memory matrix.

A CBRAM cell possesses an electrode made of an electrochemically active metal such as silver (Ag) or copper (Cu). High-mobility $Ag^+$ cations drift in a conductive layer, for example made of germanium sulphide ($GeS_2$), and are rejected at an anode, for example one made of tungsten (W). This leads to the growth of Ag dendrites, i.e. to the formation of a high-conductivity filament. Once this filament has formed, the CBRAM circuit is in what is called the ON state. The resistance of the circuit is then very low. Therefore, its conductance $G=1/R$ is very high.

When a voltage of inverse polarity is applied to the terminals of the CBRAM cell, the conductive bridge is dissolved electrochemically and the circuit is then in the OFF position.

System reset is then spoken of. In the OFF position, the resistance of the circuit is then high. Therefore, its conductance $G=1/R$ is low.

Using CBRAM cells in neuromorphic systems has a number of advantages. Specifically, the manufacture of the system is made easier, and the system is CMOS compatible. The choice of this type of cells is very advantageous for the design of biologically inspired low-power systems.

In the prior art, multi-level programming of CBRAM cells has been proposed in order to imitate the plasticity of biological synapses. However, this approach implies that each neuron must generate pulses the amplitude of which increases while still preserving a history of the prior state of the synaptic cells, thereby leading to additional complexity in the neuromorphic system.

SUMMARY OF THE INVENTION

One aim of the invention is notably to alleviate the aforementioned drawbacks.

For this purpose, one subject of the invention is a neuromorphic system comprising a set of at least one input neuron, a set of at least one output neuron and a synaptic network formed from a set of at least one variable-resistance memristive component. Said synaptic network connects at least one input neuron to at least one output neuron, the resistance of the at least one memristive component being adjusted by delivering to the synaptic network write pulses generated by the at least one input neuron, and return pulses generated by the at least one output neuron. The characteristics of the write and return pulses are deduced from the intrinsic characteristics of the at least one memristive component, preferably from the intrinsic switching probability of said component, so that the combination of a write pulse and a return pulse in the at least one memristive component results in a modification of its resistance according to a learning rule chosen beforehand.

According to one aspect of the invention, the learning rule is a biologically inspired rule of the STDP type.

The write pulses are for example LTD and LTP pulses.

In one embodiment, the system uses a learning rule that has been optimized with an evolutionary algorithm.

The learning rule for example defines a switching probability of the memory cells from a first state to a second state, switching being considered to have taken place when the ratio between the resistance value of the cell in the first state and the resistance value of the cell in a second state is greater than a preset value.

According to another aspect of the invention, the characteristics of the write and return pulses are defined by choosing a combination of the following parameters:
  pulse width;
  rise and fall time of the pulse; and
  amplitude of the pulse.

In one embodiment, a second sub-set of memory cells is configured using a random number generator allowing the emission of write pulses by the at least one output neuron to be blocked or authorized in accordance with a preset learning rule.

The memristive components are for example CBRAM cells.

Alternatively, the memristive components may be produced in PMC, PCM, OXRAM, MRAM or STTRAM technology.

Another subject of the invention is a method for defining write pulses and return pulses able to adjust the resistances of memristive components used in the neuromorphic system according to the invention, said method comprising the following steps:

determining the switching probability of the memristive components from a first state to a second state depending on the parameters of the pulses applied to it;

selecting a set of characteristic parameters for a pulse allowing a switching probability associated with a preset STDP learning rule to be obtained; and defining a read pulse and a write pulse the combination of which allows a pulse respecting the parameter set identified in the preceding step to be obtained.

Another subject of the invention is a computer program stored on a computer-readable medium, comprising instructions for executing the attributing method described above.

BRIEF DESCRIPTION OF THE DRAWINGS

Other features and advantages of the invention will become apparent from the following description given merely by way of nonlimiting illustration, and with regard to the appended drawings, in which.

DETAILED DESCRIPTION

Figure 1:
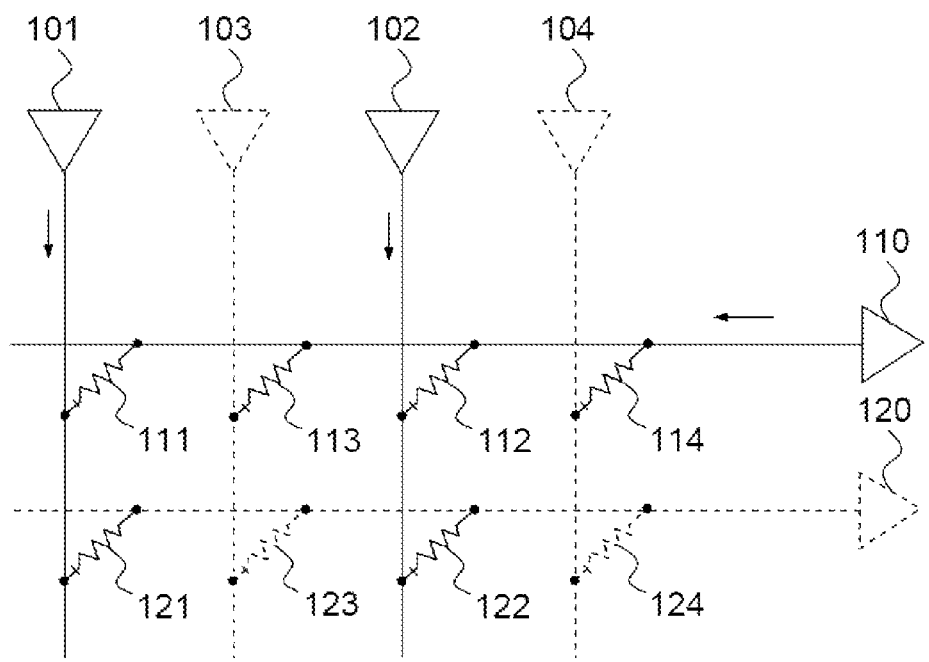
FIG. 1 shows a functional diagram of an artificial neural network according to the prior art.

FIG. 1 shows a functional diagram of an artificial neuronal network according to the prior art.

A plurality of input neurons 101, 102, 103, 104 are connected to a plurality of output neurons 110, 120 by way of a plurality of artificial synapses 111, 112, 113, 114, 121, 122, 123, 124. An artificial synapse may be formed by means of a memristive component the conductance G of which varies depending on the current or the voltage applied to its terminals. A synapse 111 has one of its two terminals connected to an input neuron 101, and the other terminal connected to an output neuron 110. An artificial neuron is an active component that may simultaneously or separately have the functions of input neuron and/or output neuron. An artificial neuron is called an input neuron when it is connected downstream of a synapse and an output neuron when it is connected upstream of a synapse. The artificial neurons may be active or inactive. In FIG. 1, by way of example, the input neurons 101, 102 are considered to be active and the input neurons 103, 104, inactive. Likewise, the output neuron 110 is active whereas the output neuron 120 is inactive. A neuron is active when, at a given moment, it emits a pulse. The length of its "active" state may be preset.

Figure 2:
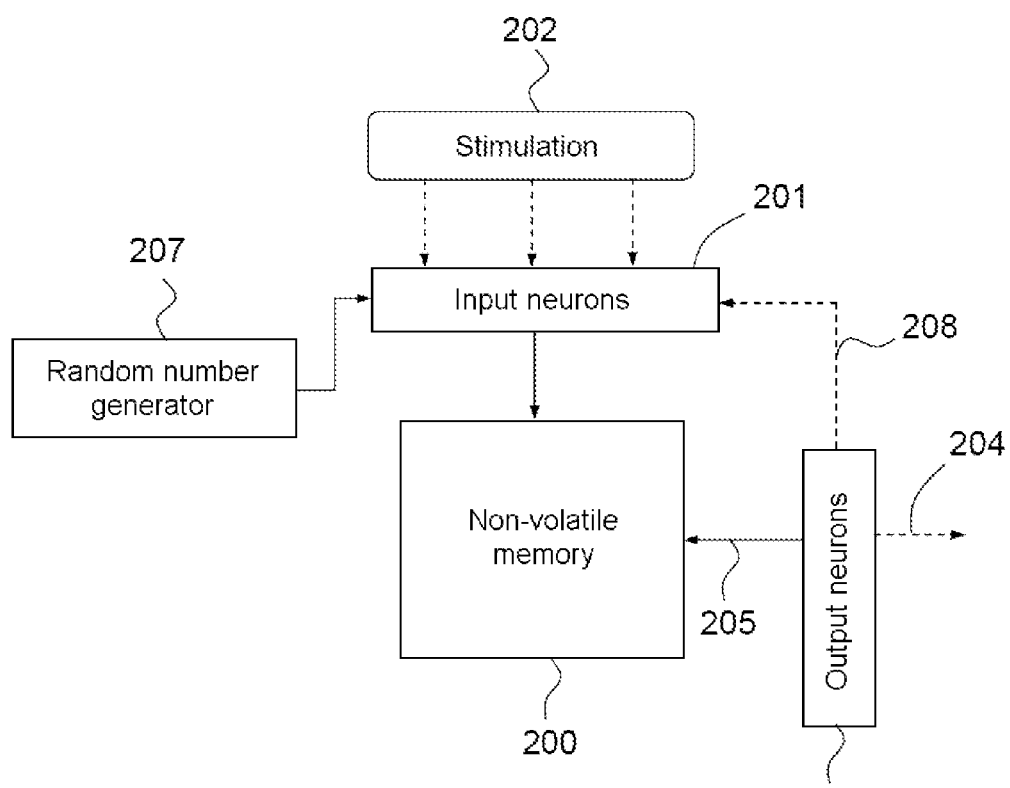
FIG. 2 shows an example of a neuromorphic system able to implement the invention.

FIG. 2 shows an example of a neuromorphic system able to implement the invention.

Such a system may be implemented in a single dedicated circuit, in a programmable circuit or using a combination of both. Thus, certain portions may be implemented by a software program and others using dedicated architectures.

This system is composed of four main blocks. A first block 200 employs a non-volatile memory matrix or a "crossbar" memory.

In this description, CBRAM technology is taken by way of example, but the invention is also applicable to other types of resistive memories implementing nanoscale technology, such as programmable metallization cell (PMC), phase change memory (PCM) or oxide based memory (OXRAM) technologies. It may furthermore be applied to magnetic memories such as magnetoresistive random access memory (MRAM) or spin-transfer torque random access memory (STT-RAM).

In this description, the expressions "memristive component", "variable-resistance memory cell", and "memory cell" are equivalent and denote any non-volatile component the resistance of which may be programmed.

A block 201 comprising input neurons is used to generate input signals that will be injected into the memory block 200. Various types of neuron models may be used. By way of example, leaky integrate-and-fire (LIF) neurons may be used.

The input neurons may be stimulated by a block 202 generating stimulation signals conventionally denoted by the term "spikes". This block for example emulates the internal ear, and in particular the cochlea. Other applications may also be considered. Another example is the use an artificial retina as a stimulation block 202. More generally, the block 202 may be a source of any type of asynchronous or synchronous digital or analogue data used as input in order to carry out shape recognition, classification of patterns, or signal processing. This model may be based on a biological model.

A block 206 comprising output neurons is used to generate the output signals 204 of the neuromorphic system. These neurons generate, in certain cases, signals 205, 208 allowing the memory matrix comprising the synapses to be taught.

A random number generator 207 may be used with the aim of implementing, in a portion of the memory circuit, any type of probabilistic or stochastic learning rule, such as for example an STDP rule.

FIGS. 3 to 7 give an example of implementation of an STDP learning rule in a neuromorphic system comprising a memory matrix composed of eight CBRAM cells.

Figure 3:
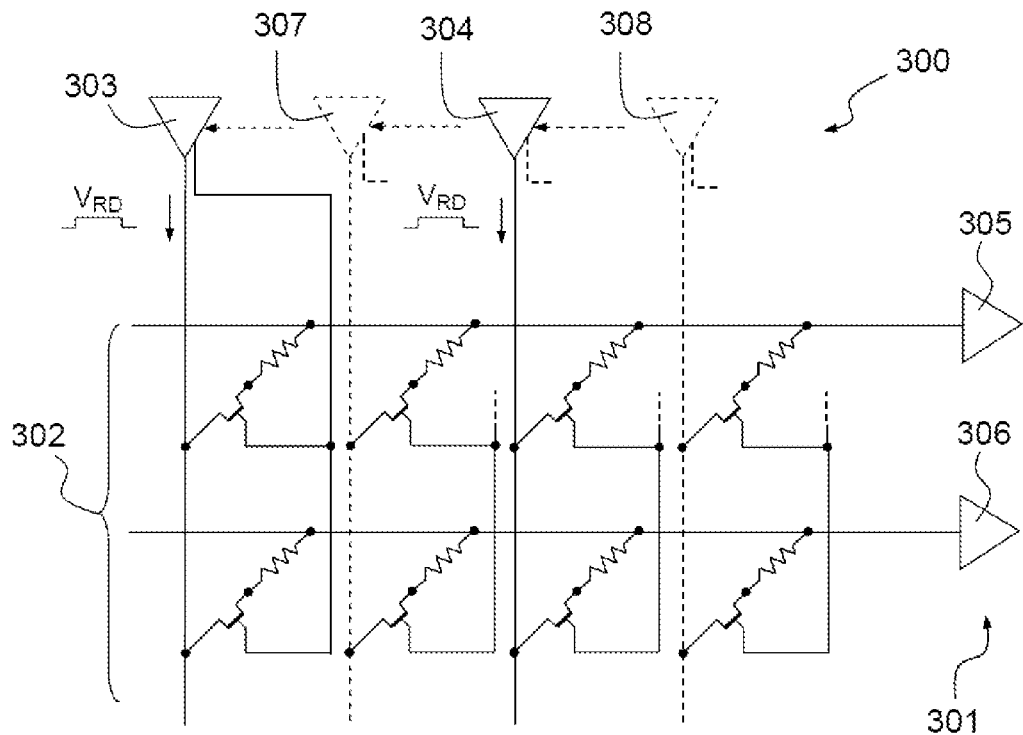
FIG. 3 illustrates the operation of a neuromorphic system operating in read mode.

FIG. 3 illustrates the operation of a neuromorphic system operating in read mode. The read mode is a mode in which the weight of the synapses cannot be modified, in contrast to the write mode.

The example shown comprises four input neurons 300 and two output neurons 301. The synapses are formed using a matrix comprising eight CBRAM cells.

When an input neuron detects an event, based on input data, it generates, in read mode, a low-voltage pulse VRD that propagates to all the output neurons by way of the synapses connecting them together.

In this example, input signals are present on the neurons 303 and 304, which are active. For this reason they are drawn with solid lines. Therefore, each of these neurons 303, 304 generates a voltage signal VRD. These read pulses propagate through the matrix 302 in order to reach the two output neurons 305, 306.

A read voltage pulse VRD induces, in the synapses, a current that is inversely proportional to their resistance. For example, when the neurons 303, 304 generate a voltage pulse VRD, the current flowing through all the synaptic lines is added or integrated by the output neurons 305, 306. When the sum of the total current inside a LIF output neuron reaches a certain threshold, it triggers and generates an electric pulse. In this case, the output neuron is active, and drawn with solid lines. The write mode is activated when an output neuron triggers.

The weight of the synapses cannot be modified in read mode because the pulse VRD is defined such that it does not disturb the state of the cell. It is just sufficient to read the resistance of the synaptic device. The weight of the synapse may be modified or programmed only in write mode.

Figure 4:
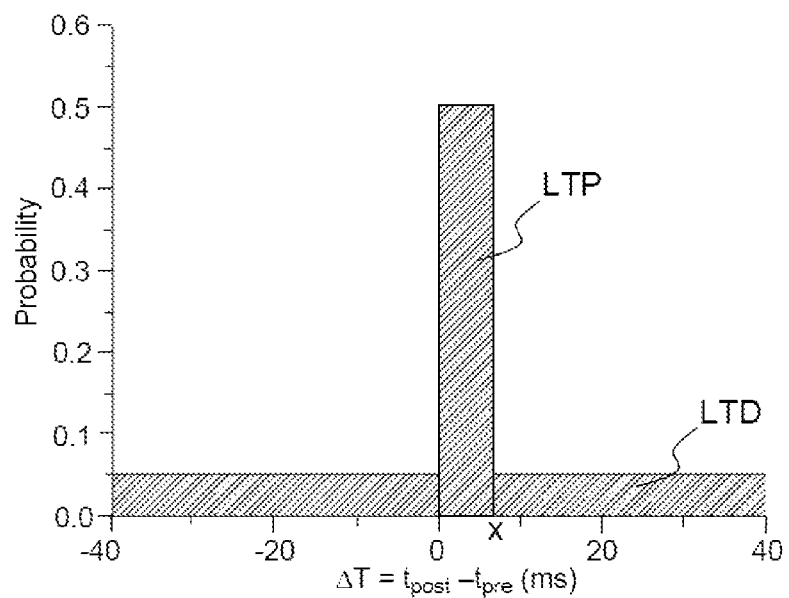
FIG. 4 gives an example STDP rule.

FIG. 4 gives an example STDP rule. The switching probability to a final state is shown on the y-axis.

The x-axis shows the time difference ΔT, expressed in milliseconds, between a post-synaptic pulse emitted at the time $t_{post}$ and a pre-synaptic pulse emitted at the time $t_{pre}$, in a given CBRAM synapse.

When an input neuron is activated, it enters into what is called an LTP mode. The input neuron remains in this LTP mode for a length of time defined by the length of the LTP window associated with the STDP rule to be implemented. By way of example, an activated neuron may remain in the LTP mode for x milliseconds.

The learning rule may be finely defined with regard to the intended application of the neuromorphic system. The probability associated with the LTP and LTD windows may be refined depending on the desired precision, for example in the context of shape recognition applications.

Using evolutionary algorithms such as genetic algorithms, optimized values of the LTP and LTD probabilities may be determined. The evolutionary algorithm may be executed on any general-purpose neural network simulator. By way of example, operation of the simulator Xnet is described in the article by O. Bichler et al. entitled *Extraction of temporally correlated features from dynamic vision sensors with spike-timing-dependent plasticity*, 2012 Special Issue, Elsevier, Neural Networks 32 (2012) 339-348.

Figure 5:
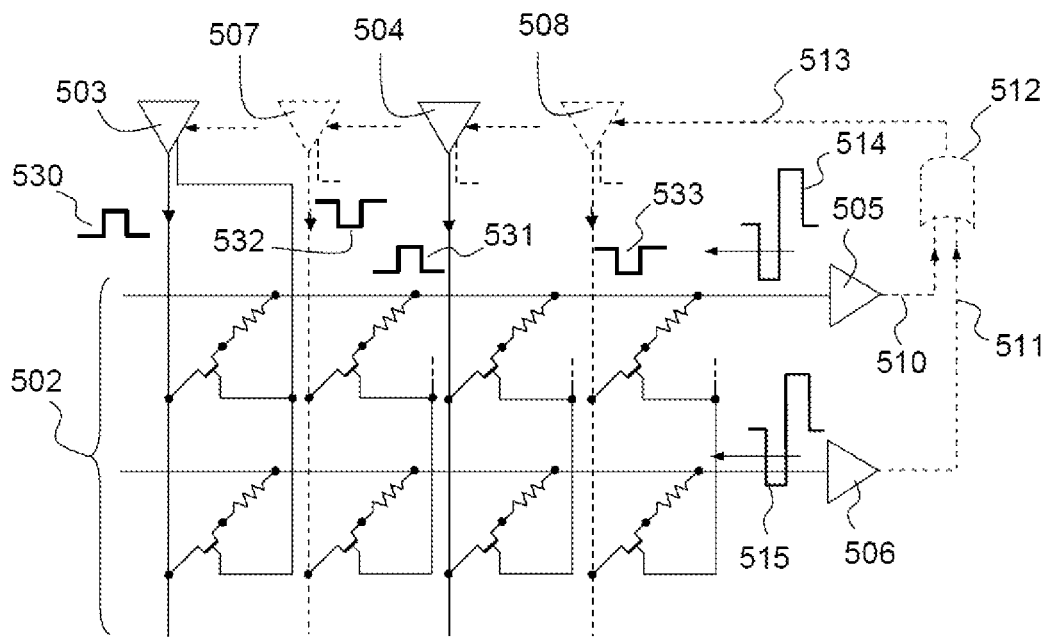
FIG. 5 illustrates the operation of a neuromorphic system in write mode.

FIG. 5 illustrates the operation of a neuromorphic system in write mode.

The circuit shown is, by way of example, identical to that shown in FIG. 3. It comprises four input neurons 503, 504, 507, 508 and two output neurons 505, 506. The synapses are formed using a matrix 502 comprising eight CBRAM cells.

In order to describe operation of the neuromorphic system in write mode, it is assumed that, at the end of the read mode, the two output neurons 505, 506 achieved the triggering threshold and that they therefore generated two output signals (not shown).

When an output neuron triggers, in addition to emitting an output signal, it performs two tasks.

The first task corresponds to the emission of a control signal 510, 511. These signals are combined 512 in order to generate a single control signal 513 intended to be delivered to the input neurons in order to indicate that a write operation must be carried out. For example, a unified control signal 513 is generated if at least one control signal is delivered to the input of a combining module 512.

The second task consists in emitting a return pulse 514, 515 that is sent back over the synaptic lines connecting the output neuron to the input neurons.

Once the output neuron has triggered and the input neurons have received the control signal 513 indicating the passage to write mode, there are a number of ways to update synaptic weights according to the STDP learning rule.

If the input neuron has been activated beforehand and is in LTP mode when the neuron is triggered, it generates an LTP-type write pulse 530, 531 that will lead to a decrease in the resistance of the synapses after combination with the return pulse.

Otherwise, if the input neuron has not been activated beforehand or if the write control signal 513 was received when the input neuron is no longer in LTP mode, a write pulse of LTD type 532, 533 must be generated. In this case, the resistance of the synapses may increase after combination with the return pulse.

Figure 6:
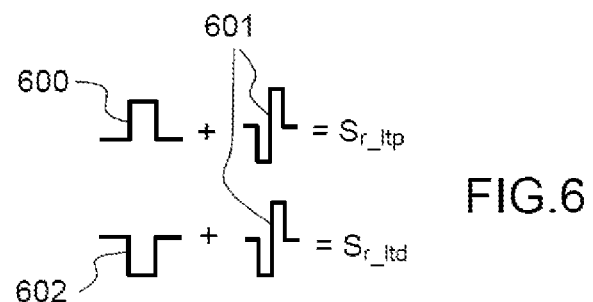
FIG. 6 illustrates the principle of combination of LTP or LTD pulses with a return pulse.

FIG. 6 illustrates the principle of combination of LTP or LTD pulses with the return pulse.

The shape of the LTP and LTD pulses and the shape of the return pulse depend on the type of technology used in the memory matrix. In this example, the memory matrix is formed, for example, using CBRAM cells. Thus, the shapes of the LTP and LTD pulses and of the return pulse must be defined in accordance with the following principles. When the return pulse 601 and the LTP pulse 600 interact in a memory cell, the resulting pulse Sr_ltp is positive, having the effect of decreasing the resistance.

Moreover, when the return pulse 601 and the LTD pulse 602 interact in a memory cell, the resulting pulse Sr_ltd is negative, having the effect of increasing the resistance of the cell.

The return pulse 601 is defined so that, if it reaches a memory cell without interacting with an LTD or LTP pulse, the resistance of said cell will not be modified.

In a stochastic system, using a pseudo-random number generator 207, 320, 520 is one way to introduce the LTP and LTD probabilities and thus implement the learning rule, an STDP learning rule for example.

Figure 7:
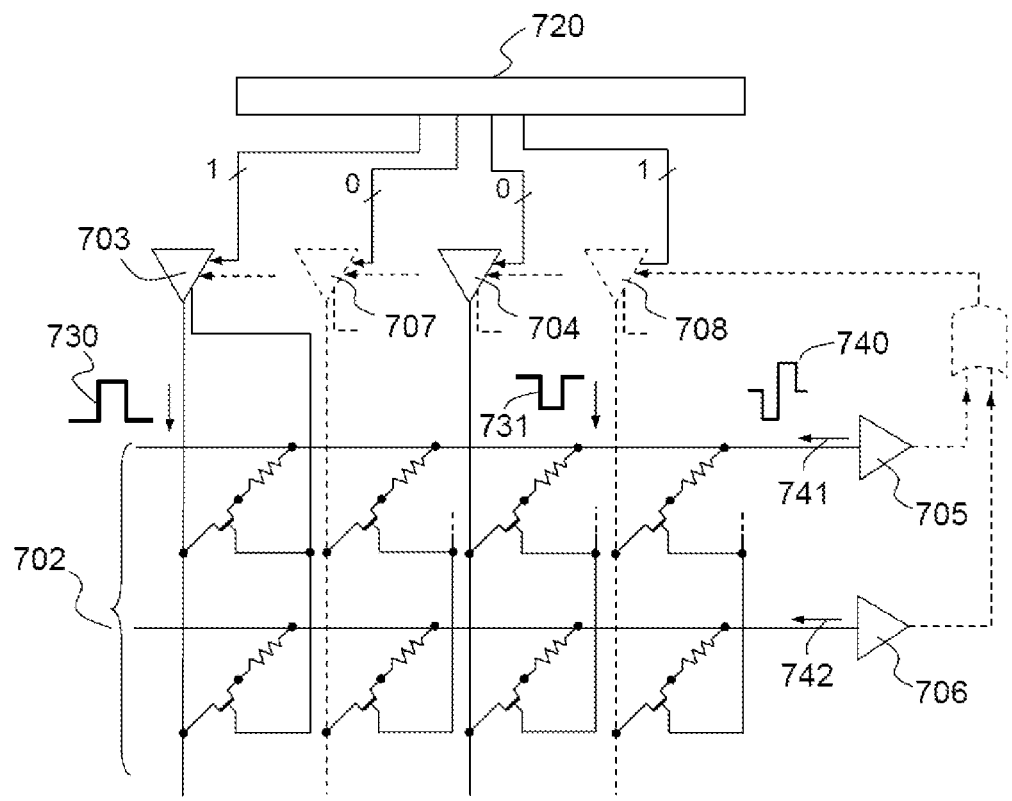
FIG. 7 illustrates the way in which a random number generator may be used to implement a learning rule in a neuromorphic system.

FIG. 7 illustrates the way in which a random number generator 720 may be used to implement a learning rule in a neuromorphic system. This technique is notably described in patent application US 2012/0011093.

FIG. 7 shows an example of a neuromorphic system comprising four input neurons 703, 704, 707, 708 and two output neurons 705, 706. The synapses are formed using a matrix 702 comprising CBRAM cells.

In one embodiment, the outputs of the generator 720 are connected to the input neurons so that the random numbers generated can be multiplied by the output signals generated by the input neurons 703, 704, 707, 708. The generator generates as output "zeroes" and "ones" with the LTP and LTD probabilities defined by the STDP rule, an example of which is given in FIG. 4.

According to the principles explained above, the input neurons 703, 704 are in LTP mode and therefore have the vocation of emitting an LTP-type pulse 730. Furthermore, no signal is present on the input of the neurons 707, 708. The latter are not in LTP mode and therefore have the vocation of emitting an LTD-type pulse 731.

In the example given, at a time t, and so as to introduce the LTD and LTP probabilities associated with the STDP learning rule chosen, the generator 720 generates and delivers a "one" to the neurons 703 and 708 and a "zero" to the neurons 704 and 707. This has the effect of inhibiting the neurons 704 and 707, which will not emit any pulses. The generator 720 is designed to prevent LTD or LTP pulses from being emitted as many times as is necessary to configure the memory matrix in accordance with the STDP learning rule.

FIGS. 3 to 7 allowed the learning principle applied in a neuromorphic system to be described with respect to a particular example using a random number generator.

The neuromorphic system according to the invention relies on a novel approach in which the implementation of the learning rule is based on adapting the characteristics of the LTD, LTP and return pulses to the intrinsic characteristics of the memory cells.

An example of an intrinsic characteristic is the intrinsic switching probability, also called the stochasticity, of the memory cells, a necessary characteristic of the nanoscale resistive memory devices (a.k.a memristive components) that can be employed in systems of the neuromorphic type.

In simple terms, the switching probability P may be defined using the following expression:

$$P = Nsuccess/Ntrials$$

in which:
Nsuccess is the number of successful switches; and
Ntrials is the total number of times it has been attempted to switch a synapse.

Whether or not switching is considered to have taken place depends on the electrical specifications of the memory circuits used, on account of factors such as power dissipation and the complexity of the circuits.

By way of example, switching may be considered to have taken place if the resistance ratio is greater than ten, said resistance ratio being defined by the following expression:

$$\theta = \frac{R\_off}{R\_on}$$

in which:
R_off is the resistance of the CBRAM cell in its OFF state; and
R_on is the resistance of the CBRAM cell in its ON state.

For memristive components, such as, for example, CBRAM cells based on $GeS_2$ and Ag, it appears, surprisingly, that the switching probability from a first conductance state to a second conductance state may be controlled by changing the programming conditions of the synapse. In the rest of the description, the expression "programming conditions" denotes a set of at least one characteristic parameter of the LTD, LTP and/or return pulses.

In one embodiment of the invention, the switching probability may be adjusted by choosing with care an appropriate combination of the following parameters:
  pulse width;
  the rise and fall time of the pulse; and
  the amplitude of the pulse.

A separate parameter combination may be chosen for the LTD pulses, on the one hand, and for the LTP pulses, on the other hand.

Figures 8A, 8B:
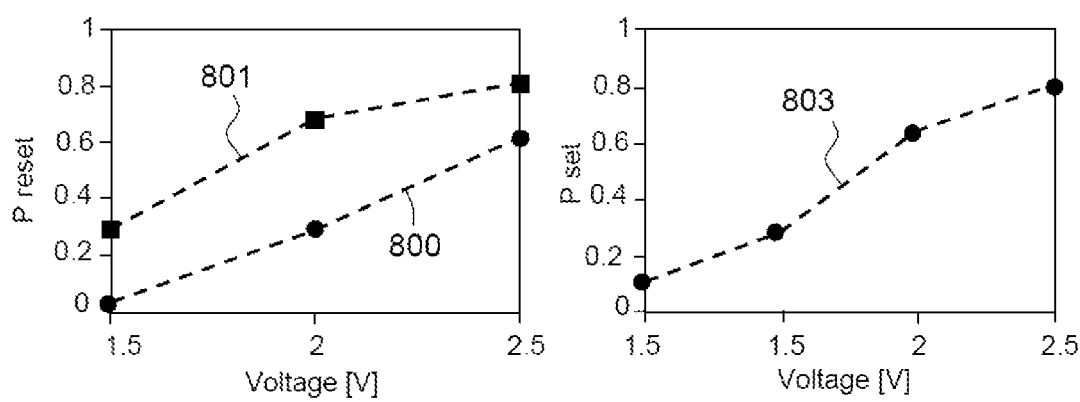
FIG. 8a gives an example of the variation in switching probability Preset obtained by modifying the voltage applied to a CBRAM memory.
FIG. 8b gives an example of the variation in switching probability Pset obtained by modifying the voltage applied to a CBRAM memory.

FIG. 8a gives an example of the variation in switching probability Preset from the ON state to the OFF state for a CBRAM cell based on $GeS_2$ and Ag.

To change states, it is conventional to use a pulse the amplitude of which corresponds to the line voltage, also referred to as the "bit-line voltage".

In this example, the resistance ratio $\theta$ is greater than ten. Two curves 800, 801 are shown. The y-axis corresponds to the switching probability Preset from the ON state to the OFF state. The x-axis corresponds to the line voltage Vg expressed in volts.

The first curve 800 corresponds to a pulse width equal to five-hundred nanoseconds and the second curve 801 corresponds to a pulse width equal to one microsecond. In this example, the rise time and the fall time are chosen to be identical for both curves. The first curve 800 indicates that with a voltage applied to the terminals of the CBRAM cell equal to two volts, a switching probability equal to 0.3 is achieved. As for the second curve 801, it appears that for the same voltage value, a switching probability equal to 0.7 is achieved. This clearly shows that by choosing the parameters of the pulses used, the switching probability of the resistive element acting as a synapse may be finely adjusted. These parameters may be defined using, for example, curves that are obtained empirically.

FIG. 8b gives an example of the variation in switching probability Pset from the OFF state to the ON state for a CBRAM memory cell based on $GeS_2$ and Ag.

To change to the low state using this type of memory, it is conventional to use a pulse the amplitude of which corresponds to the anode voltage. The y-axis corresponds to the switching probability from the OFF state to the ON state. The x-axis corresponds to the line voltage expressed in volts. A curve 803 is given by way of example and shows that with an amplitude equal to two volts, a switching probability equal to 0.63 is achieved.

Figure 9:
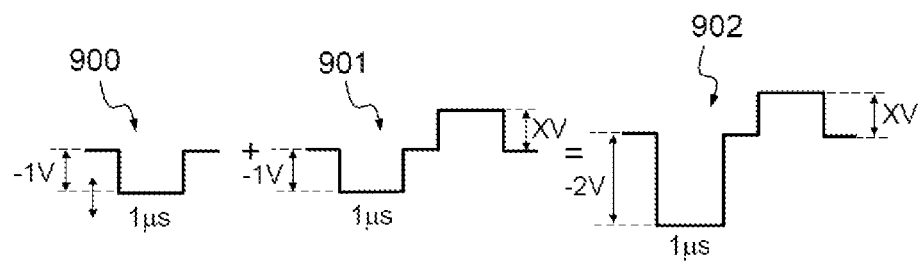
FIG. 9 gives an example of programming pulses allowing a target intrinsic probability to be obtained when CBRAM cells based on $GeS_2$ and Ag are used.

FIG. 9 gives an example of programming pulses allowing a target switching probability to be obtained when CBRAM cells based on $GeS_2$ and Ag are used.

In this example, passage from the ON state to the OFF state of the CBRAM cells is targeted with a probability of 0.7, corresponding to the selected learning rule. To do this, it is necessary to generate an LTD pulse. On the basis of FIG. 8a, the pulse resulting from the combination of the LTD pulse and the return pulse must have an amplitude equal to two volts and a width of one microsecond.

XV indicates that this portion of the pulse must be chosen on the basis of criteria other than the intrinsic characteristics of the memory cell. The rise and fall time of each pulse may for example be set equal to two-hundred nanoseconds.

In order to determine the programming conditions, a number of alternatives may be envisaged.

A first approach consists in using a predictive model of the behaviour of the memristive components employed. This model may be empirical, phenomenological, compact, behavioural, or physical. Simulations may also be used. The objective is to obtain a set of parameters in order to generate pulses allowing a given switching probability to be achieved, and this whatever the technology used to form the synapses.

In an alternative approach, the programming conditions of the synaptic technology are determined at the "wafer level", i.e. before packaging of the neuromorphic system. This characterization may be carried out automatically or manually, for example using a probe. Parametric tests may also be used.

In a third approach, the programming conditions may be determined by direct measurements carried out on the neuromorphic system. Advantageously, this method allows variations in the switching characteristics of a neuromorphic system to be followed in real-time after packaging and integration. These real-time data then allow the programming conditions to be adapted to the system in order to obtain the best results.

Once the programming conditions have been determined, the neuromorphic system may then be programmed.

The programming conditions are memorized in the neuromorphic system in such a way that the input and output neurons are able to emit pulses adapted to the intrinsic characteristics of the memory cells, in order to allow the learning rule chosen for the neuromorphic system to be implemented.

The use of programming conditions adapted to the intrinsic characteristics of the memory cells has the key advantage of making it possible for the neuromorphic system to consume less power. Furthermore, the architecture of the system is simplified since it is only necessary to memorize pulses adapted to implementing the learning rule.

In another embodiment, the neuromorphic system may be programmed both using programming conditions adapted to the intrinsic characteristics of the memory cells, but also using, in combination, a random number generator as explained above. Thus, if a plurality of memory matrices are used in the system, some of these matrices may be configured using the programming conditions adapted to the intrinsic characteristics of the memory cells, and the rest of the matrices may be configured using the random number generator. This embodiment has the advantage of increasing the implementation flexibility of the system. Specifically, if certain probability values are not obtainable using the programming conditions adapted to the intrinsic characteristics of certain memory cells, the technique based on the use of a random number generator may advantageously be employed.

The invention claimed is:

1. A neuromorphic system comprising a set of at least one input neuron, a set of at least one output neuron and a synaptic network formed from a set of at least one variable-resistance memristive component, said synaptic network connecting at least one input neuron to at least one output neuron, the resistance of the at least one memristive component being adjusted by delivering to the synaptic network write pulses generated by the at least one input neuron, and return pulses generated by the at least one output neuron, the characteristics of the write and return pulses being deduced from the intrinsic characteristics of the at least one memristive component, preferably from the intrinsic switching probability of said component, so that the combination of a write pulse and a return pulse in the at least one memristive component results in a modification of its resistance according to a learning rule chosen beforehand.

2. The system according to claim 1, wherein the learning rule is a biologically inspired rule of the STDP type.

3. The system according to claim 1, wherein the write pulses are LTD and LTP pulses.

4. The system according to claim 2, using a learning rule that has been optimized with an evolutionary algorithm.

5. The system according to claim 1, wherein the learning rule defines a switching probability of the memory cells from a first state to a second state, switching being considered to have taken place when the ratio between the resistance value of the cell in the first state and the resistance value of the cell in a second state is greater than a preset value.

6. The system according to claim 1, wherein the characteristics of the write and return pulses are defined by choosing a combination of the following parameters:
   pulse width;
   rise and fall time of the pulse; and
   amplitude of the pulse.

7. The system according to claim 1, wherein a second sub-set of memory cells is configured using a random number generator allowing the emission of write pulses by the at least one input neuron to be blocked or authorized in accordance with a preset learning rule.

8. The system according to claim 1, wherein the memristive components are CBRAM cells.

9. The system according to claim 1, wherein the memristive components are produced in PMC, PCM, OXRAM, MRAM or STTRAM technology.

10. A method for defining write pulses and return pulses able to adjust the resistances of memristive components used in the neuromorphic system according to any one of the preceding claims, said method comprising:
   determining the switching probability of the memristive components from a first state to a second state depending on the parameters of the pulses applied to it;
   selecting a set of characteristic parameters for a pulse allowing a switching probability associated with a preset STDP learning rule to be obtained; and
   defining a read pulse and a write pulse the combination of which allows a pulse respecting the parameter set identified in the preceding step to be obtained.

11. A computer program stored on a computer-readable medium, comprising instructions for executing the attributing method according to claim 10.

* * * * *